United States Patent [19]
Chadda

[11] 4,202,916
[45] May 13, 1980

[54] SURFACING PROCESS FOR THE STABILIZATION OF SEMICONDUCTOR BODIES EMPLOYING GLASS CONTAINING QUARTZ PASSIVATING LAYER

[75] Inventor: Madan M. Chadda, Nurmberg-Gaulnhofen, Fed. Rep. of Germany

[73] Assignee: Semikron Gesellschaft für Gleichrichterbau und Elektronik m.b.H, Nuremberg, Fed. Rep. of Germany

[21] Appl. No.: 936,885

[22] Filed: Aug. 25, 1978

[30] Foreign Application Priority Data

Sep. 3, 1977 [DE] Fed. Rep. of Germany ....... 2739762

[51] Int. Cl.² .......................................... H01L 21/473
[52] U.S. Cl. .................................... 427/82; 357/54;
  427/93; 427/240; 427/193; 427/226; 427/376.2;
  427/419.4; 427/430.1
[58] Field of Search ...................... 357/54; 427/93, 82,
  427/193, 226, 376 A, 419 C

[56] References Cited

U.S. PATENT DOCUMENTS

| | | | |
|---|---|---|---|
| 3,212,921 | 10/1965 | Pliskin et al. | 427/93 |
| 3,303,399 | 2/1967 | Hoogendoorn et al. | 427/93 |
| 3,546,013 | 12/1970 | Perri et al. | 427/93 |
| 3,632,434 | 1/1972 | Hutson | 427/93 |
| 3,669,693 | 6/1972 | Dalton et al. | 427/93 |
| 3,752,701 | 8/1973 | Morrissey | 427/93 |
| 3,967,310 | 6/1976 | Horiuchi et al. | 357/54 |
| 4,080,621 | 3/1978 | Funakawa et al. | 357/54 |
| 4,086,613 | 4/1978 | Biet et al. | 427/93 |

FOREIGN PATENT DOCUMENTS 63160 1/1977 Japan ......................................... 427/93

OTHER PUBLICATIONS

Pikor "Glass Passivation of Semiconductor Devices", Technical Notes RCA, 2/5/1975.

*Primary Examiner*—John D. Smith
*Attorney, Agent, or Firm*—Spencer & Kaye

[57] ABSTRACT

In a surfacing process for the stabilization of semiconductor wafers in which a glass coating is provided on the surface of the semiconductor at least in the region where a pn-junction thereof extends to the surface, the glass coating is provided by directly forming on the surface of the semiconductor a layer of the oxide of the semiconductor material, applying to the semiconductor oxide layer, by melting, a base layer composed of a common glass having a thermal coefficient of expansion matched to that of the semiconductor material, and applying to the base layer a terminating layer of a glass which has a thermal coefficient of expansion lower than that of the semiconductor material, by melting such glass at a temperature in a higher temperature range adjacent that required for melting the glass of the base layer.

14 Claims, 1 Drawing Figure

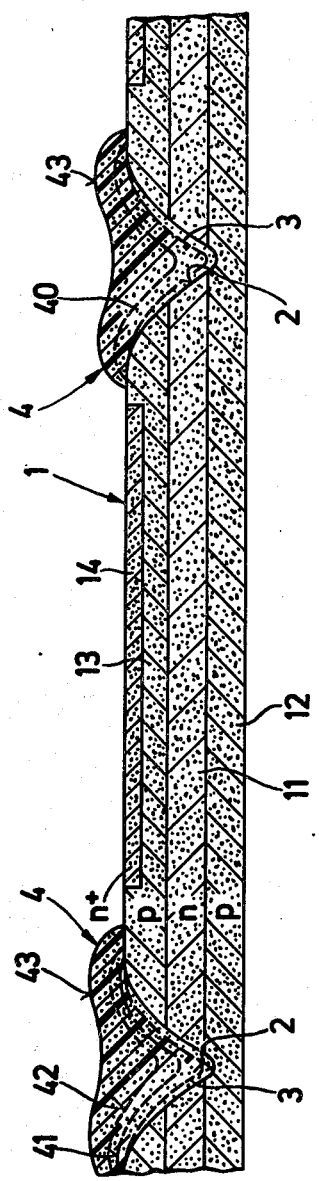

SURFACING PROCESS FOR THE STABILIZATION OF SEMICONDUCTOR BODIES EMPLOYING GLASS CONTAINING QUARTZ PASSIVATING LAYER

BACKGROUND OF THE INVENTION

The present invention relates to a surfacing process for stabilizing semiconductor wafers, or slices, of the type in which a glass coating is deposited on a surface of the semiconductor slice at least in the region of the exposed edges of the pn-junctions formed in the slice. This coating produces an effect generally referred to as passivation.

As is well known in the semiconductor industry, semiconductor slices having a sequence of layers of alternately different conductivity types, are provided at the surface thereof, at least in the region of edges of the pn-junctions, with a protective varnish coating which serves to stabilize the reverse, or blocking, characteristics of the resulting semiconductor devices. Preferably, this protective varnish coating consists of organic materials and prevents the capture of unwanted impurities on the semiconductor surface from the surrounding atmosphere, as well as the deleterious effects of existing impurities.

To develop this stabilizing effect, it is necessary to subject commonly known protective varnishes to a heat treatment after they have been applied to the surface of the semiconductor.

Such surface treatment has significant disadvantages, however. If small-surface devices are obtained by cutting a pretreated parent semiconductor slice into pieces, the contact electrodes of the devices must be fabricated because of the required processing temperatures prior to covering the particular surface regions of the devices with the stabilizing coating. This process, because it uses protective varnishes for passivation purposes, calls for a large number of additional steps which can not be economically justified, particularly for miniature, i.e. microprocessing, devices.

Furthermore, during the fabrication of small and medium-power semiconductor devices which are to be encapsulated in plastic, there is frequently an unwanted long-term reaction between the material of the protective varnish coating and the encapsulation material, resulting in impairment of the stability of the operating characteristics of the semiconductor devices.

Therefore, an urgent need has been felt for a type of passivation which will eliminate these problems.

To accomplish these objectives, it is common practice to passivate semiconductor surfaces with the aid of a layer of vitreous material, as exemplified in U.S. Pat. No. 3,632,434. To attain this result, an appropriate surface of the semiconductor slice is coated with a mixture containing a glass, preferably ground powder form, and a liquid, e.g. organic, component as a binder for the glass powder. After applying this mixture, e.g. by spreading or spraying, the slice is heated in an oxygen atmosphere to a temperature below the fusion temperature of the glass. In this way, there is formed on the semiconductor surface an oxide layer of the semiconductor material, while the organic component is burned off and removed from the mixture. The glass is left remaining on the semiconductor surface in the form of a compacted layer adhering to the semiconductor oxide layer.

The slice is then heated in an oxygen-free atmosphere, so that the glass is melted and fused to the surface to form a firmly adhering and homogeneous coating. Glasses containing lead oxide, silicon dioxide and aluminum oxide are commonly employed.

In this known method, passivation of the semiconductor device, obtained by cutting a parent slice into pieces, may be effected before the contact electrodes are mounted. However, it has the drawback that, due to differences in the thermal coefficients of expansion of the glasses being employed and of the semiconductor material within the semiconductor device operating temperature range of 150° to 200° C. currently desired, and due to variations of the surface loads upon putting the devices into operation, cracks occur in the glass coating and, thereby, unwanted reductions occur in the critical field strength of the surface.

This detrimental effect is found particularly in glass coatings on large-area wafers which are to have a high current-carrying capability and in fairly thick coatings on wafers which are to have a high reverse-voltage, or blocking, capability. Consequently, it has heretofore not been possible to make glass coatings with a thickness in excess of 30$\mu$, so that the blocking capability of glass-passivated semiconductor devices, in view of the known interrelation that a layer thickness of 10–15$\mu$ assures a voltage-carrying capability of about 300 V, does not in all instances attain the values made possible by protective-varnish passivation. For this reason, present-day glass-passivated semiconductor devices, and more particularly medium and high-power devices, can only be employed for operating temperatures up to about 115° to 125° C.

SUMMARY OF THE INVENTION

It is therefore a primary object of the invention to provide a glass coating, whose thermal characteristics readily permit the use of glass-coated semiconductor devices at operating temperatures up to 200° C. and which can be fabricated with a thickness that permits a desirable elevated reverse-voltage load.

These and other objects are achieved, according to the present invention in a surfacing process for the stabilization of semiconductor wafers in which a glass coating is provided on the surface of the semiconductor at least in the region where a pn-junction thereof extends to the surface, in that the glass coating is provided by directly forming on the surface of the semiconductor a layer of the oxide of the semiconductor material, applying to the semiconductor oxide layer, by melting, a base layer composed of a common glass having a thermal coefficient of expansion matched to that of the semiconductor material, and applying to the base layer a terminating layer of a glass which has a thermal coefficient of expansion lower than that of the semiconductor material, by melting such glass at a temperature in a higher temperature range adjacent that required for melting the glass of the base layer.

BRIEF DESCRIPTION OF THE DRAWING

The single FIGURE is a cross-sectional view of a portion of a semiconductor slice manufactured according to the invention.

DESCRIPTION OF THE PREFERRED EMBODIMENTS

The method of the invention will now be described with reference to the multilayer semiconductor slice shown in the FIGURE, in which a glass coating with associated sublayers is provided according to the invention.

In the illustrated arrangement, a parent semiconductor slice 1 is provided with a sequence of layers 11, 12, 13 of alternately different conductivity types and, in conformity with a pattern for separating it into devices or wafers each having a small surface area, the slice is provided with groove-like, e.g. wedge-type, channels 2 which cut through the pn junctions formed between the semiconductor layers so that these junctions extend to the walls of the channels. Channels 2 are used for the arrangement of stabilizing coatings on the semiconductor surface in these regions where the pn-junctions are thus exposed.

On the semiconductor surface, which has been cleaned conventionally by an etching process, a layer 3 having a thickness of the order of 100 Å and is composed of the oxide of the semiconductor material is produced by oxidation in an etchant or by heat treatment, as the first step of the process according to the invention. Layer 3 is a surface layer which is easily wettable for the succeeding glass coating and which is also known to trap unwanted impurities still existing on the semiconductor surface when the glass coating is deposited at a later step. Layer 3 and the subsequent glass layers completely cover the walls of channels 2.

To obtain a base layer of glass in a later step, there is produced on this semiconductor oxide layer 3, shown in broken lines, a first sublayer 41 of glass, likewise shown in broken lines. To accomplish this objective, a commonly known glass in the form of a powder and having a particle size prescribed by the manufacturer is mixed into a binder, likewise prescribed by the manufacturer, e.g., a photoresist or -2(2-butoxyethoxy) ethyl acetate. This mixture may be applied by dipping or spinning the semiconductor slice, or by spreading or spraying. A suitable spinning procedure is disclosed, for example, in U.S. Pat. No. 3,632,434.

The semiconductor surface may be cleaned by the known etch solution CP 4 and the layer 3 can be made by etching with sulphuric acid at 90° C. for 5 to 15 min. or in an atmosphere of water steam at 1000° C. or 900° C. for 1 or 3 hours. Known glasses for the base layer are the glass series IP 700 and IP 800 sold by Innotec or the type G 017/002 of Schott, each with a grain size of less than 25 μm.

In a subsequent heat treatment in an oxygen atmosphere the slice is heated to a temperature of between 500° and 600° C., during which the semiconductor oxide layer 3 is further strengthened and the binder of the mixture is eliminated completely. The latter is a prerequisite for proper passivation. The temperature is then further increased to the melting temperature specified for the particular glass coating being produced which, for the lead-alumina-silicate glasses commonly employed, is between, for example, 750° and 800° C.

The thickness of glass layer 41 is of no consequence. However, in view of the demand that the layer must be continuous and free of cracks and must tightly adhere to the surface so as to prevent the capture of unwanted impurities during the further processing after formation of the first glass layer, it should not exceed 15μ.

According to the invention, a second sublayer 42 is produced in a similar manner on the first sublayer 41, for instance, from the same material and with substantially the same thickness.

The material for the second sublayer should be selected to ensure that its characteristics correspond to those of the material of the first sublayer. Types of glass and process steps for obtaining both glass layers are known in sufficient detail and the glass type is not a novel feature of the invention.

During the fabrication of the second glass layer 42, both layers 41 and 42 fuse to form a new, thicker glass coating constituting the base layer. As for the characteristics of the base layer, the invention requires that its main coefficients, i.e. coefficient of thermal expansion and coefficient of thermal conductivity, coincide with those of the semiconductor material. Various types of glass with corresponding physical characteristics may likewise be employed to form layers 41 and 42.

Instead of two layers 41 and 42 forming the base layer, only one layer 40 with corresponding thickness may likewise be applied, as shown at the right side of the FIGURE. This is particularly true of semiconductor slices whose surface regions to be coated have a fairly small area of expansion. On the other hand, in slices for devices which are to have substantial current-carrying capability, i.e., with a large-area space-charge region in the zone of the pn junction, it is advisable to apply two layers each of lesser thickness. A thicker layer replacing the two layers 41 and 42 should not exceed 25μ in thickness.

According to the invention, a terminating third, or second, glass layer 43 is applied to the base layer composed of glass layers 41 and 42, or layer 40. Layer 43 has a comparatively larger thickness and a coefficient of thermal expansion up to 30% smaller than that of layers 41 and 42, or layer 40. Terminating layer 43 may have any given thickness, which should at least be 30μ. Thus, according to the known interrelation between the layer thickness of the glass and the blocking-voltage-carrying capability mentioned above, values of the latter substantially higher than heretofore possible are assured. Further, the lower thermal coefficient of expansion assures that the operating temperature in the semiconductor material will remain within a desired range.

In accordance with preferred embodiments of the invention, to obtain a glass coating for the above operating conditions, the terminating layer can be formed from quartz with a high degree of purity, added in powdered form and in a proportion of from 0.5 to 10 percent by weight to glass identical to that employed heretofore for the base layer, this batch being mixed into a binder, as above described.

Other forms of quartz may likewise be employed.

Terminating layer 43 is applied to the base layer in a manner similar to that used for the preceding sublayers and fused thereto within a processing-temperature range immediately above the temperature range for producing layers 41, 42, preferably at a temperature of between 790° and 830° C.

As an example, semiconductor devices were obtained with a passivating glass coating fabricated in accordance with the method of the invention which exhibited stable characteristics in the semiconductor material at an operating temperature of 170° C. and a blocking-voltage-carrying capability of 2500 V.

The method of the invention may likewise be applied if the parent semiconductor slice provided for separation into devices has grooves, or channels, 2 in both faces, which cut through at least one pn-junction. In this case, passivation is effected such that the treatment of the surface regions on one face of the slice is carried out with a glass coating at a given elevated melting temperature followed by the treatment of the surface regions of the other face with a glass coating at a correspondingly lower melting temperature so as to prevent further melting of the coating at the first face.

However, the method of the invention is not limited to the treatment of surface regions of a parent semiconductor slice provided for separation into a number of semiconductor devices. It is likewise applicable to semiconductor slices which have at least one pn-junction and are provided as semiconductor devices without being cut into discs and which possess a large active region for high-current-carrying capability and have a surface region which requires the surface treatment either by virtue of a groove along its space-charge region or by being chamfered. To prevent the molten glass material from flowing away to the chamfered space-charge region of a semiconductor slice during the melting operation, suitably designed high-melting moldings may be used which form a cavity with the semiconductor slice at the outer contour thereof for the application of the glass coating.

The present invention can be applied, for example, to semiconductor slices, or discs, made of silicon.

The surfacing process according to the invention may be realized as following:

the semiconductor wafers, which are provided with a pn-junction, are masked with an etching resist varnish, e.g. Picein or CX 200 according to the pattern of the provided grooves.

the grooves are etched in one of the known etching solutions such as hydrofluoric acid, nitric acid and acetic acid, which guarantees a uniform etching profile, at approximately 15° C. deeper than the pn-junction.

the etching resist varnish is removed.

impurities of the etching resist varnish are removed from the surface by short etching in solution with perchloric acid.

the wafers are then provided with the oxide layer 3, either by dipping in 100% nitric acid at 60° C. or by oxidizing in a steam atmosphere at 900° to 1100° C. to obtain a layer having a thickness of 500 Å to 1 μm.

lead-boron-silicate-glass or zinc-silicate-glass having a thermal coefficient of expansion which corresponds to that of the semiconductor material, for example a glass of the IP 700 series or IP 800 series of Innotec is deposited on the oxide layer to form the base layer 40 or first and second base sublayers 41, 42.

quartz of extremely high purity in a quantity of 5 to 10 weight percent, also in powder form, is admixed with the provided glass choosen for the base layer.

The melting temperature regions depend on the choosen glass and are determined so that the melting temperature region of the following glass layer is always higher than that of the preceding layer. When the base layer is subdivided into two sublayers 41, 42 the temperature of the first sublayer may be—750° to 780° C.
the second sublayer may be—770° to 800° C.
the final layer may be—790° to 830° C.

The higher the share of quartz, the higher is the melting temperature of the final layer 43 and the lower is its thermal coefficient of expansion.

The glass layers 41, 42 or 40 and 43 may be deposited by spraying or spinning and also by silk screen printing. Melting of the glass is carried out in an atmosphere of 20% oxygen and 80% nitrogen.

The first layer 3 extends over the whole semiconductor surface, as it is not developed by arrangement of material but by oxidizing of the semiconductor material. On the other hand, the surface extension of the layers 40 to 43 is restricted by the limited arrangement of the respective glass mixture on the region of the groove-formed recesses. The layer 3 is in the region of the contact surfaces of the semiconductor wafers before the metallization of the same is again removed.

It will be understood that the above description of the present invention is susceptible to various modifications, changes and adaptations, and the same are intended to be comprehended within the meaning and range of equivalents of the appended claims.

What is claimed is:

1. In a surfacing process for the stabilization of semiconductor wafers in which a glass coating is provided on the surface of the semiconductor at least in the region where a pn junction thereof extends to the surface, the improvement wherein the glass coating is provided by: directly forming on the surface of said semiconductor a layer of the oxide of the semiconductor material; forming on said semiconductor oxide layer, by melting, a base layer composed of a common glass having a thermal coefficient of expansion matched to that of said semiconductor material; and forming on said base layer a terminating layer of a glass containing quartz which has a thermal coefficient of expansion lower than that of said semiconductor material, by melting said quartz-containing glass at a temperature in a higher temperature range adjacent that required for melting the glass of said base layer.

2. A process as defined in claim 1 wherein said step of forming said semiconductor oxide layer is carried out to form a semiconductor oxide layer having a maximum thickness of 100 Å.

3. A process as defined in claim 2 wherein said step of forming said semiconductor oxide layer comprises treating the surface with an etching fluid.

4. A process as defined in claim 2 wherein said step of forming said semiconductor oxide layer is carried out by performing a heat treatment.

5. A process as defined in claim 1 wherein said step of forming a base layer comprises depositing two glass layers, each having a maximum thickness of 15μ, onto said semiconductor oxide layer to produce said base layer.

6. A process as defined in claim 5 wherein lead-alumina-silicate glasses are employed for said base layer.

7. A process as defined in claim 5 wherein said layers constituting said base layer are composed of respectively different types of glass having substantially the same physical characteristics.

8. A process as defined in claim 1 wherein said terminating layer is composed of a mixture of a glass forming said base layer and from 0.5 to 10 percent, by weight, of quartz.

9. A process as defined in claim 8 wherein the quartz employed has a high degree of purity.

10. A process as defined in claim 8 wherein said terminating layer has a thickness of the order of at least 30μ.

11. A process as defined in claim 8 wherein each said step of forming said base and terminating layers is carried out with the material which is to constitute the layer in the form of a powder mixed with a binder and each glass layer is formed by a heat treatment which completely eliminates the binder.

12. A process as defined in claim 11 wherein each said step of forming said base and terminating layers comprises depositing the mixture from which the glass layer is to be formed onto said semiconductor surface by spreading, spraying or spinning.

13. A process as defined in claim 11 wherein said step of forming a base layer is carried out by establishing a melting temperature of between 750° and 800° C., and said step of applying a terminating layer is carried out by establishing a melting temperature of between 790° and 830° C.

14. A process as defined in claim 1 wherein the wafer is a parent slice whose surface is provided with grooves along which the slice is to be divided into individual semiconductor devices, the grooves intersecting a pn junction present in the slice, and said glass coating is disposed on the walls of said grooves.

* * * * *